(12) United States Patent
Shiraki

(10) Patent No.: US 12,009,333 B2
(45) Date of Patent: Jun. 11, 2024

(54) SEMICONDUCTOR DEVICE

(71) Applicant: SHINKO ELECTRIC INDUSTRIES CO., LTD., Nagano (JP)

(72) Inventor: Satoshi Shiraki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 315 days.

(21) Appl. No.: 17/645,815

(22) Filed: Dec. 23, 2021

(65) Prior Publication Data

US 2022/0115353 A1   Apr. 14, 2022

Related U.S. Application Data

(62) Division of application No. 16/510,087, filed on Jul. 12, 2019, now Pat. No. 11,239,196.

(30) Foreign Application Priority Data

Aug. 6, 2018   (JP) ................. 2018-147942

(51) Int. Cl.
*H01L 23/00* (2006.01)
*H01L 23/053* (2006.01)
(Continued)

(52) U.S. Cl.
CPC ........ *H01L 24/32* (2013.01); *H01L 23/49513* (2013.01); *H01L 23/49558* (2013.01);
(Continued)

(58) Field of Classification Search
CPC ..... H01L 24/29; H01L 24/32; H01L 23/3735; H01L 23/49582; H01L 23/49586; H01L 23/04; H01L 24/27; H01L 23/49558; H01L 24/83; H01L 23/5329; H01L 23/49513; H01L 23/49575; H01L 24/85; H01L 24/45; H01L 21/52; H01L 2224/27848; H01L 2224/32225; H01L 2224/29017; H01L 2224/29347; H01L 2224/45124; H01L 2224/83194; H01L 2224/45147;
(Continued)

(56) References Cited

U.S. PATENT DOCUMENTS

2014/0061909 A1* 3/2014 Speckels ................. H01L 24/29
                                                          438/121
2015/0171054 A1* 6/2015 Yamayose ............... H01L 24/83
                                                          228/256

(Continued)

FOREIGN PATENT DOCUMENTS

JP    2014-029897    2/2014
JP    2017-108192    6/2017

*Primary Examiner* — Mouloucoulaye Inoussa
(74) *Attorney, Agent, or Firm* — IPUSA, PLLC

(57) ABSTRACT

A semiconductor device includes a metal chip mounting member and a semiconductor chip bonded to the chip mounting member through a metal sintered material, wherein the metal sintered material includes a first portion overlapping the semiconductor chip in a plan view, and includes a second portion surrounding the semiconductor chip in the plan view, and wherein a porosity ratio of the first portion is greater than or equal to 1% and less than 15%, and a porosity ratio of the second portion is greater than or equal to 15% and less than or equal to 50%.

18 Claims, 6 Drawing Sheets

(51) Int. Cl.
*H01L 23/495* (2006.01)
*H01L 23/532* (2006.01)

(52) U.S. Cl.
CPC .. *H01L 23/49575* (2013.01); *H01L 23/49582* (2013.01); *H01L 23/49586* (2013.01); *H01L 23/5329* (2013.01); *H01L 24/27* (2013.01); *H01L 24/29* (2013.01); *H01L 24/83* (2013.01); H01L 23/053 (2013.01); H01L 23/49503 (2013.01)

(58) Field of Classification Search
CPC ... H01L 2224/8384; H01L 2924/10253; H01L 2224/2784; H01L 2224/3201; H01L 2224/45144; H01L 2924/10272; H01L 2224/29339; H01L 23/49503; H01L 2224/83192; H01L 2924/12032; H01L 2224/29018; H01L 2224/48247; H01L 2224/83498; H01L 2224/2732; H01L 2224/29355; H01L 2224/29019; H01L 2224/29247; H01L 2924/3512; H01L 2224/27312; H01L 2224/29266; H01L 2224/29239; H01L 2224/29218; B22F 7/064; B22F 7/06
USPC .......................................... 257/773; 438/125
See application file for complete search history.

(56) References Cited

U.S. PATENT DOCUMENTS

| | | |
|---|---|---|
| 2017/0294397 A1 | 10/2017 | Croteau et al. |
| 2018/0096919 A1 | 4/2018 | Roth et al. |
| 2019/0006268 A1* | 1/2019 | Sugiura ............. H01L 23/49568 |
| 2019/0393188 A1* | 12/2019 | Takemasa ............... B22F 7/064 |

* cited by examiner

SEMICONDUCTOR DEVICE

CROSS-REFERENCE TO RELATED APPLICATIONS

The present application is a divisional of U.S. patent application Ser. No. 16/510,087 filed on Jul. 12, 2019, which is based on and claims priority to Japanese Patent Application No. 2018-147942 filed on Aug. 6, 2018, with the Japanese Patent Office. The entire contents of these applications are incorporated herein by reference.

FIELD

The disclosures herein relate to a semiconductor device and a method of making a semiconductor device.

BACKGROUND

A semiconductor device such as a power semiconductor device using large currents may employ a metal sintered material, which is superior to solder in heat resistance, for connection between a semiconductor chip and chip mounting parts (e.g., an interconnect layer and a lead frame) in consideration of a large amount of heat generated by the semiconductor chip. Various studies have been made to improve reliability with respect to semiconductor devices employing a metal sintered material (see Patent Documents 1 and 2, for example).

When making a semiconductor device employing a metal sintered material, a paste of a metal sintered material may be printed on and around the chip mounting areas of the chip mounting member, followed by heating and applying pressure to the paste of a metal sintered material through the semiconductor chip.

In such a case, the paste of a metal sintered material situated in the chip mounting areas receives pressure from the semiconductor chip, but the paste of a metal sintered material situated in the surrounding areas of the chip mounting areas are not subjected to pressure. The paste that is not subjected to pressure does not experience sufficient sintering, which results in weakly bonded, fragile metal strips being left around the semiconductor chip. Fragile metal strips may disengage at later process steps to cause malfunction of the semiconductor device, thereby lowering the reliability of the semiconductor device.

Accordingly, there may be a need to improve the reliability of a semiconductor device having a metal sintered material.

RELATED-ART DOCUMENTS

Patent Document

[Patent Document 1] Japanese Patent Application Publication No. 2017-108192

[Patent Document 2] Japanese Patent Application Publication No. 2014-029897

SUMMARY

According to an aspect of the embodiment, a semiconductor device includes a metal chip mounting member and a semiconductor chip bonded to the chip mounting member through a metal sintered material, wherein the metal sintered material includes a first portion overlapping the semiconductor chip in a plan view, and includes a second portion surrounding the semiconductor chip in the plan view, and wherein a porosity ratio of the first portion is greater than or equal to 1% and less than 15%, and a porosity ratio of the second portion is greater than or equal to 15% and less than or equal to 50%.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Structure of Semiconductor Device of First Embodiment

Figure 1A:
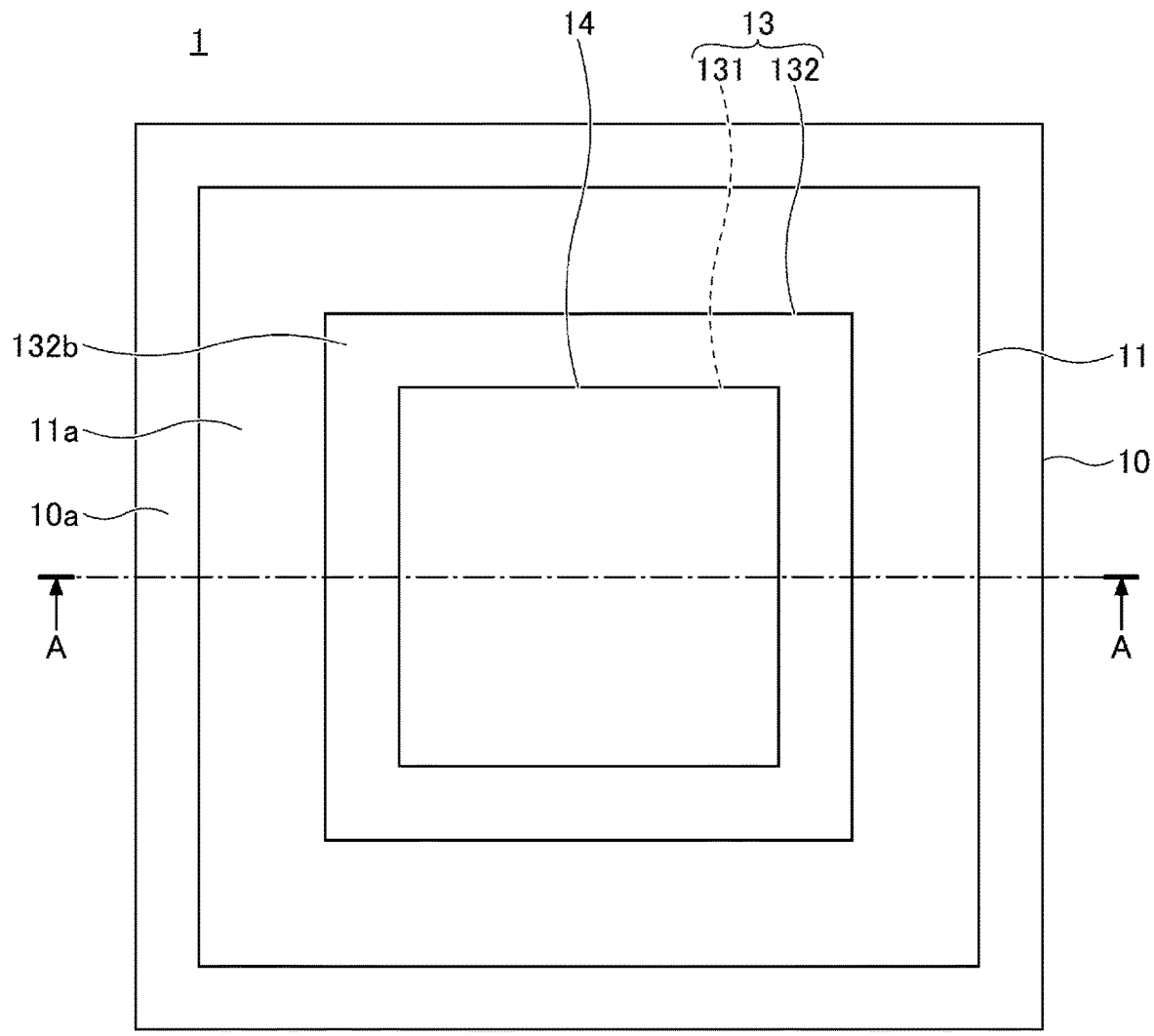
FIGS. 1A and 1B are drawings illustrating an example of a semiconductor device according to a first embodiment.
Figure 1B:
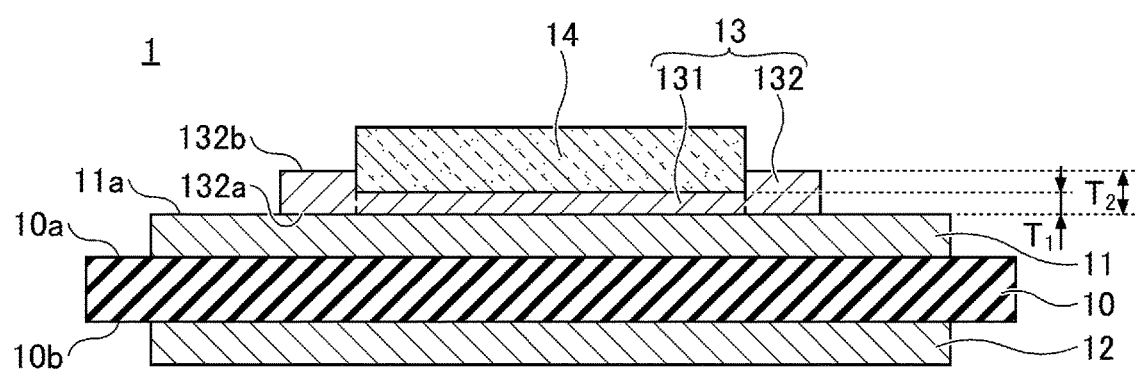

In the following, a description will be first given of the structure of a semiconductor device of a first embodiment. FIGS. 1A and 1B are drawings illustrating an example of a semiconductor device according to the first embodiment. FIG. 1A illustrates a plan view, and FIG. 1B illustrates a cross-sectional view taken along a line A-A in FIG. 1A.

With reference to FIG. 1, a semiconductor device 1 includes an insulating substrate 10, an interconnect layer 11, an interconnect layer 12, a metal sintered material 13, and a semiconductor chip 14.

In the present embodiment, for the sake of convenience, the semiconductor-chip-14 side of the semiconductor device 1 is referred to as an upper side or a first side, and the interconnect-layer-12 side of the semiconductor device 1 is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the semiconductor device 1 may be used in an upside-down position, or may be placed at any angle. Further, a plan view refers to a view taken in the direction normal to a first surface 10a of the insulating substrate 10, and a plan shape is a shape as viewed in the direction normal to the first surface 10a of the insulating substrate 10.

In the following, the individual parts of the semiconductor device 1 will be described. Although the plan shape of the semiconductor device 1 in the example illustrated in FIG. 1A is a square, this is not a limiting example. The semiconductor device 1 may have any plan shape.

The insulating substrate 10 serves as a base for forming other layers. A ceramics substrate containing $Al_2O_3$, AlN, SiN, or the like as a main component, for example, may be used as the insulating substrate 10. A photosensitive or non-photosensitive insulating resin (e.g., of a thermosetting property) containing an epoxy-based resin, a polyimide-based resin, or the like as a main component may alternatively used as the insulating substrate 10. The thickness of the insulating substrate 10 may properly be determined according to required specifications, and may be 100 to 1000 micrometers, for example.

The interconnect layer 11 is formed on the first surface 10a of the insulating substrate 10. The interconnect layer 12 is formed on a second surface 10b of the insulating substrate 10. The interconnect layers 11 and 12 may each have a square plan shape with a uniform interior, for example. The interconnect layer 11 serves as a chip mounting member on which the semiconductor chip 14 is mounted. A metal such as cupper (Cu) or the like may be used as the material of the interconnect layers 11 and 12. The thickness of each of the interconnect layers 11 and 12 may approximately be 50 to 1000 micrometers, for example. The interconnect layers 11 and 12 may each include interconnect traces having any desired patterns in addition to or in place of a uniform interior area.

The semiconductor chip 14 is bonded through the metal sintered material 13 to a first surface 11a of the interconnect layer 11 serving as the chip mounting member. More specifically, electrodes (not shown) are formed on the lower face of the semiconductor chip 14 (e.g., on the entire surface of the lower face), and these electrodes formed on the lower face of the semiconductor chip 14 are electrically connected to the interconnect layer 11 via the metal sintered material 13.

The semiconductor chip 14 is a MOSFET (metal-oxide semiconductor field effect transistor), an SBD (Schottky barrier diode), an IGBT (insulated gate bipolar transistor), or the like, for example. The size of the semiconductor chip 14 may be approximately 1 millimeter square to 10 millimeters square, for example. The thickness of the semiconductor chip 14 may approximately be 100 to 400 micrometers, for example. Si, SiC, GaN, or the like may be used as the material of the semiconductor chip 14, for example.

As the metal sintered material 13, a silver sintered material or a copper sintered material may be used, for example. Silver or copper may preferably be used as the metal contained in the metal sintered material 13, but other metals different from silver and copper may alternatively be used. An alloy of two or more metals or a mixture of two or more metals may alternatively be used.

The metal sintered material 13 includes a portion 131 overlapping the semiconductor chip 14 in the plan view, and includes a portion 132 surrounding the semiconductor chip 14 in the plan view. The portion 131 and the portion 132 are seamless and continuous with each other. For the sake of convenience, however, the boundary between the portion 131 and the portion 132 is indicated by dashed lines in FIG. 1B.

The portion 131 is a portion in which a metal such as silver or copper is disposed with a predetermined density, and the portion 132 is a portion in which a metal such as silver or copper is disposed with a lower density than in the portion 131. In other words, the porosity ratio of the portion 131 is lower than the porosity ratio of the portion 132. For example, the porosity ratio of the portion 131 may be greater than or equal to 1% and less than 15%, and the porosity ratio of the portion 132 may be greater than or equal to 15% and less than or equal to 50%. Here, the porosity ratio is the ratio of the volume of void to the entire volume of the portion of interest.

The portion 131 is thinner than the portion 132. A thickness $T_1$ of the portion 131 is substantially constant. The thickness $T_1$ of the portion 131 may approximately be 20 to 100 micrometers, for example. A thickness $T_2$ of the portion 132 is substantially constant. The thickness $T_2$ of the portion 132 may approximately be 30 to 110 micrometers, for example. The portion 132 covers at least a portion of the lateral faces of the semiconductor chip 14. The portion 132 may cover the entirety of the lateral faces of the semiconductor chip 14.

A surface 132a of the portion 132, which is in contact with the first surface 11a of the interconnect layer 11, is parallel to another surface 132b thereof that is opposite the surface 132a. In this context, the term "parallel" is intended to refer to not only a strictly parallel configuration but also a configuration that may be regarded as a substantially parallel configuration involving manufacturing errors and the like. Specifically, the term "parallel" means that the angle between the surface 132a and the surface 132b is within ±5 degrees inclusive.

Method of Making Semiconductor Device of First Embodiment

Figure 2A:
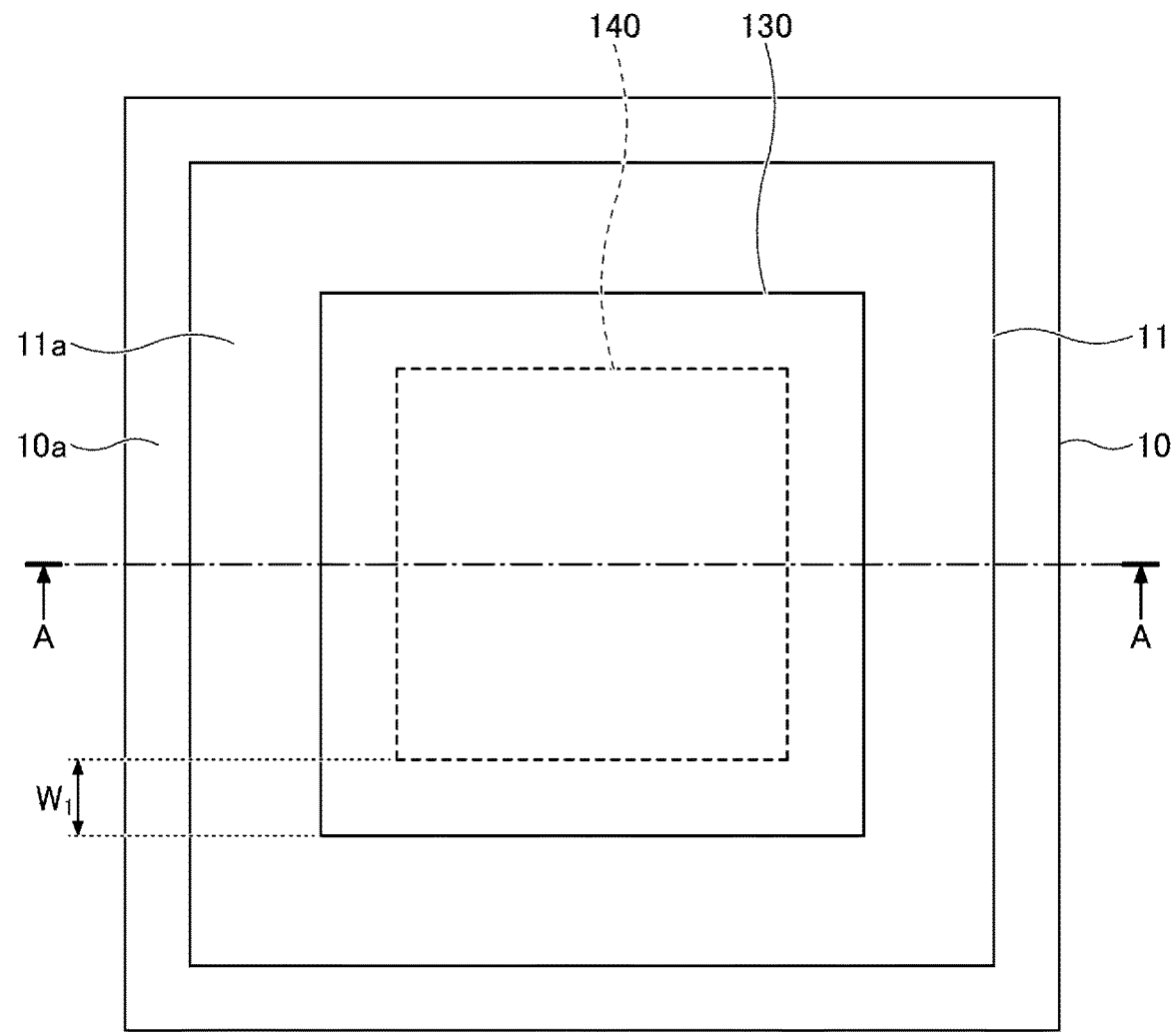
FIGS. 2A and 2B are drawings illustrating an example of a process step of making the semiconductor device according to the first embodiment.
Figure 2B:
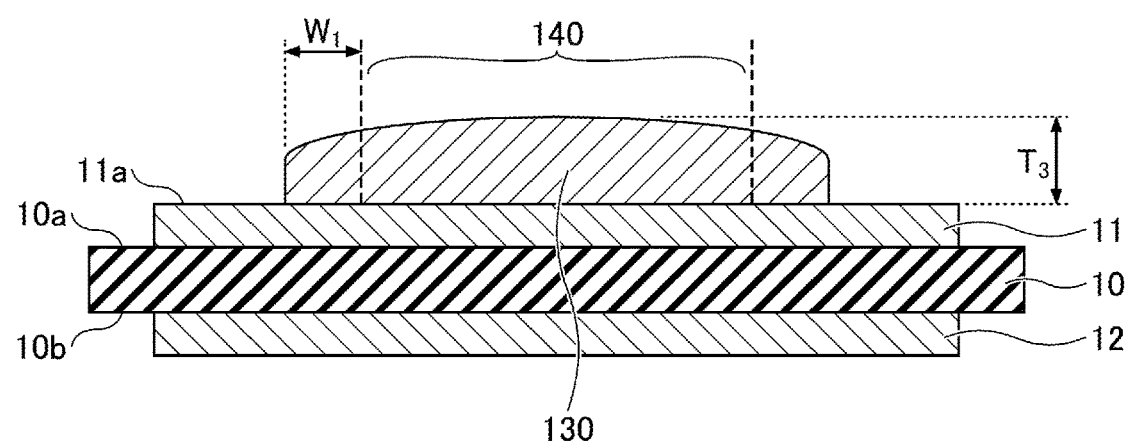
Figure 3A:
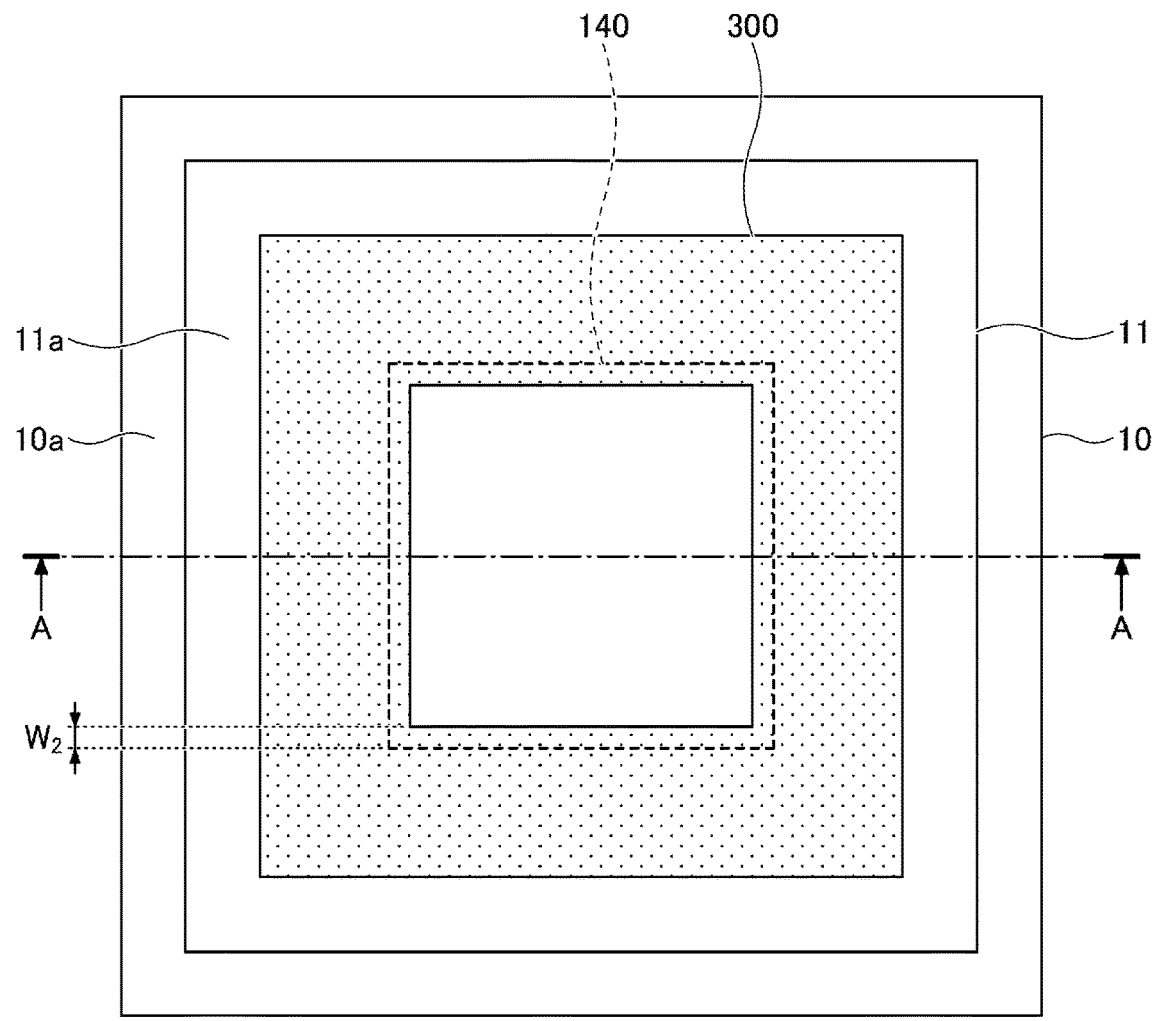
FIGS. 3A and 3B are drawings illustrating an example of a process step of making the semiconductor device according to the first embodiment.
Figure 3B:
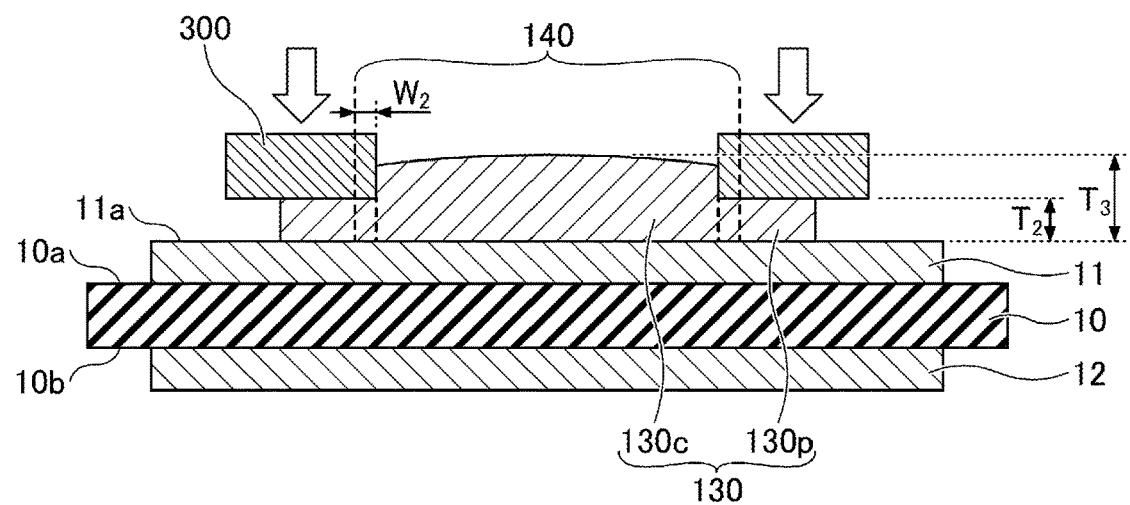
Figure 4A:
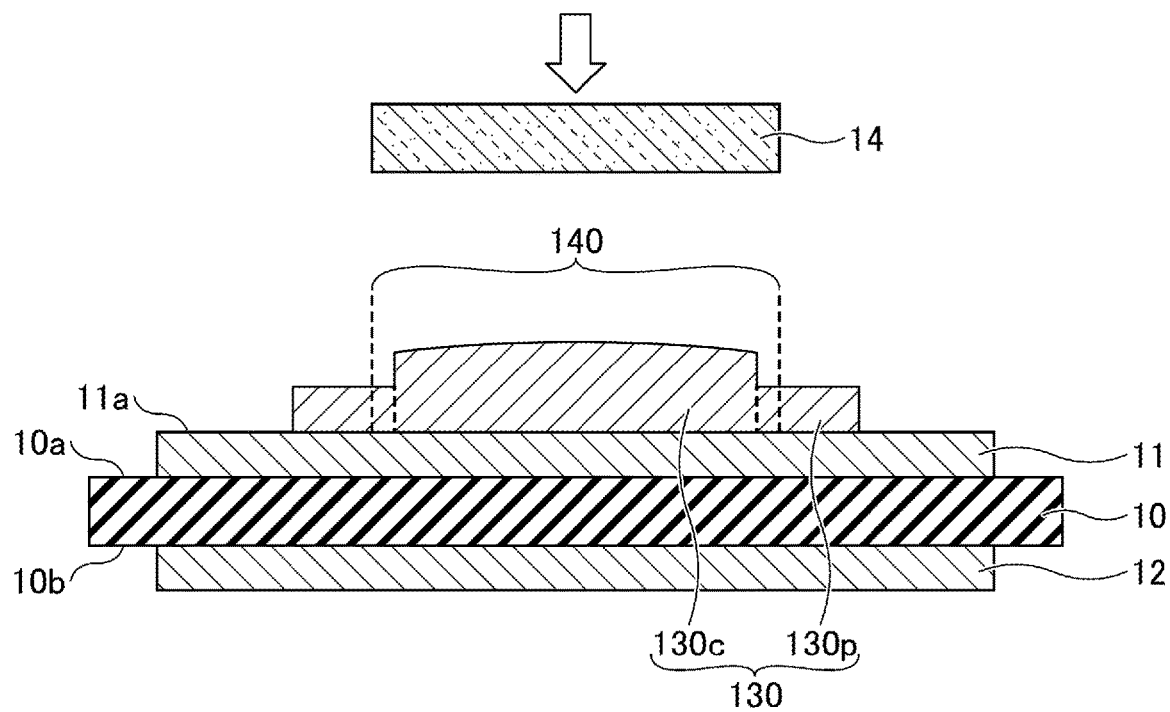
FIGS. 4A and 4B are drawings illustrating an example of a process step of making the semiconductor device according to the first embodiment.
Figure 4B:
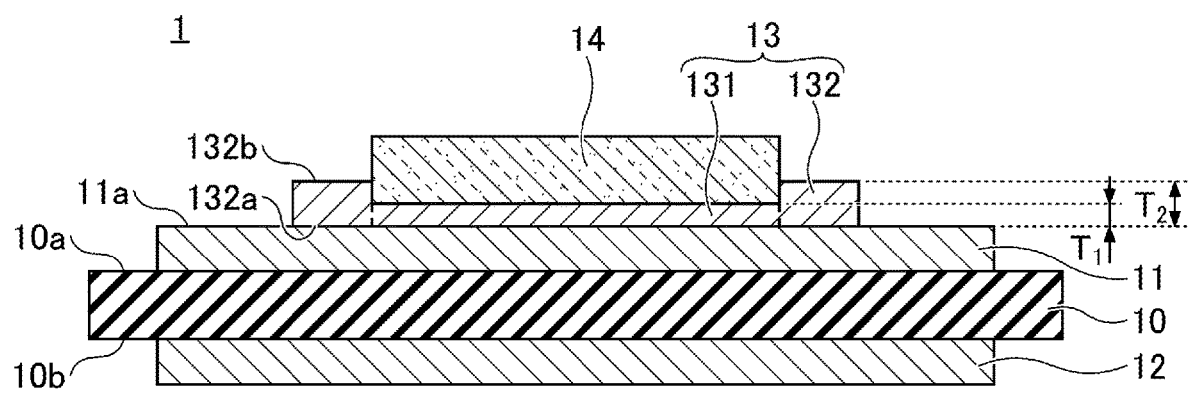

In the following, a description will be given of a method of making a semiconductor device according to the first embodiment. FIGS. 2A and 2B through FIGS. 4A and 4B are drawings illustrating examples of process steps for making a semiconductor device according to the first embodiment. FIGS. 2A and 3A are plan views, and FIG. 2B and FIG. 3B are cross-sectional views taken along the lines A-A in FIG. 2A and FIG. 3A, respectively. FIGS. 4A and 4B illustrate cross-sectional views corresponding to FIG. 1B.

In the process steps illustrated in FIGS. 2A and 2B, the insulating substrate 10 having the interconnect layer 11 formed on the first surface 10a and the interconnect layer 12 formed on the second surface 10b is prepared. The materials and thicknesses of the insulating substrate 10 and the interconnect layers 11 and 12 are as described above.

A paste 130 of a metal sintered material (e.g., silver sintered or copper sintered material) is printed and dried at and around a chip mounting area 140 of the first surface 11a of the interconnect layer 11, which serves as a chip mounting member. The drying conditions may be 120 degrees Celsius for a duration of approximately 15 minutes, for example. The paste 130 may be printed by screen printing, for example. The thickness $T_3$ of the dried paste 130 at the thickest portion may approximately be 50 to 130 micrometers, for example. The porosity ratio of the paste 130 may be approximately 60 to 70%, for example.

The paste 130 is printed to protrude into the surrounding areas of the chip mounting area 140 on the first surface 11a of the interconnect layer 11 such that the protruded part forms a frame shape, for example. The size of the chip mounting area 140 is approximately 1 millimeters square to 10 millimeters square (i.e., the same size as the semiconductor chip 14), for example. In this case, a width W1 of the frame-shape area that protrudes around the chip mounting area 140 may be approximately 50 to 200 micrometers, for example.

In the process step illustrated in FIG. 3A and FIG. 3B, a pressing device having a frame-shaped pressing part 300 is utilized to press the periphery of the paste 130 in the direction illustrated by thick arrows, thereby forming a central portion 130c and a peripheral portion 130p in the paste 130. The central portion 130c and the peripheral portion 130p are seamless and continuous with each other. For the sake of convenience, however, the boundary between the central portion 130c and the peripheral portion 130p is indicated by dashed lines in FIG. 3B.

The peripheral portion 130p is a frame-shaped portion of the paste 130 extending from inside the outer boundary of the chip mounting area 140 to the outermost periphery of the paste 130 in the plan view. In other words, applying pressure to the paste 130 is performed with respect to the frame-shaped area of the paste 130 extending from inside the outer boundary of the chip mounting area 140 to the outermost periphery of the paste 130 in the plan view. With respect to the peripheral portion 130p, a width W2 of the frame-shaped portion inside the outer boundary of the chip mounting area 140 may be approximately 0.02 millimeters to 1 millimeter, for example. Pressure applied during application of pressure may approximately be 1 MPa to 10 MPa, for example. The duration of applying pressure may approximately be a few seconds to one minute, for example.

As described above, application of pressure to the paste 130 is performed with respect to the frame-shaped area of the paste 130 extending from inside the outer boundary of the chip mounting area 140 to the outermost periphery of the paste 130 in the plan view, which provides the following advantage. Namely, the portions 131 and 132 that are eventually created through sintering are prevented from containing a fragile portion that is not sufficiently pressed.

The thickness $T_2$ of the peripheral portion 130p is thinner than the thickness $T_3$ of the thickest portion of the central portion 130c. The thickness $T_2$ of the peripheral portion 130p may approximately be 30 to 110 micrometers, for example. In addition, the porosity ratio of the peripheral portion 130p pressed by the pressing part 300 is lower than the porosity ratio (e.g., about 60 to 70%) of the central portion 130c, which is not pressed by the pressing part 300.

In this process step, the peripheral portion of the paste 130 may be heated during the application of pressure according to need. Heating during the application of pressure readily achieves a high density peripheral portion 130p.

Too-high a temperature, however, causes sintering of the central portion 130c in addition to the sintering of the peripheral portion 130p, resulting in the semiconductor chip 14 being not bonded to the interconnect layer 11 through the metal sintered material 13 in the process step illustrated in FIGS. 4A and 4B. In consideration of this, heating temperature used when heating is performed in this process step needs to be lower than the heating temperature used in the process step for bonding the semiconductor chip 14 as illustrated in FIG. 4A and FIG. 4B (i.e., be within a temperature range in which sintering does not substantially occur). The heating temperature when heating is performed in this process step may be greater than or equal to a room temperature and less than or equal to 120 degrees Celsius, for example.

In the process step illustrated in FIG. 4A, the semiconductor chip 14 is mounted on the paste 130 within the chip mounting area 140, and the paste 130 located within the chip mounting area 140 is pressed in a heated atmosphere through the semiconductor chip 14 in the direction indicated by a thick arrow. Temperature during the application of pressure may approximately be 200 to 280 degrees Celsius, for example. Pressure applied during the application of pressure may approximately be 1 MPa to 15 MPa, for example. The duration of applying pressure may approximately be 1 to 15 minutes, for example.

As a result of heating and pressing for a predetermined period of time, the paste 130 disposed at and around the chip mounting area 140 is sintered to become the metal sintered material 13 as illustrated in FIG. 4B. With this, the semiconductor device 1 is completed in final form in which the semiconductor chip 14 is bonded to the first surface 11a of the interconnect layer 11 via the metal sintered material 13.

The metal sintered material 13 includes the portion 131 overlapping the semiconductor chip 14 in the plan view, and includes the portion 132 surrounding the semiconductor chip 14 in the plan view. The portion 131 is formed as a result of sintering the entirety of the central portion 130c of the paste 130 and the inner periphery of the peripheral portion 130p (i.e., the frame-shaped area thereof inside the outer boundary of the chip mounting area 140). The portion 132 is formed as a result of sintering the outer periphery of the peripheral portion 130p (i.e., the frame-shaped area thereof around the chip mounting area 140). The surface 132a of the portion 132, which is in contact with the first surface 11a of the interconnect layer 11, is parallel to the surface 132b thereof that is opposite the surface 132a.

In the process step illustrated in FIG. 4A, pressure is higher and the period of applying pressure is longer than in the process step illustrated in FIG. 3A and FIG. 3B. As a result, the portion 131 is thinner than the portion 132, and the porosity ratio of the portion 131 is lower than the porosity ratio of the portion 132. The thickness $T_1$ of the portion 131 may approximately be 20 to 100 micrometers, for example. The thickness $T_2$ of the portion 132 may approximately be 30 to 110 micrometers, for example. The porosity ratio of the portion 131 may approximately be greater than or equal to 1% and less than 15%, for example. The porosity ratio of the portion 132 may approximately be greater than or equal to 15% and less than or equal to 50%, for example.

As is described above, the semiconductor device 1 is configured such that the portion 132 of the metal sintered material 13 surrounding the semiconductor chip 14 in the plan view is pressed prior to sintering, thereby having a lower porosity ratio than an unpressed paste (i.e., the original paste 130 before being pressed). Namely, the portion 132 of the metal sintered material 13 is in an improved bonding condition, compared to the unpressed paste. Accordingly, the risk of disengagement of the portion 132 of the metal sintered material 13 is reduced, which improves the reliability of the semiconductor device 1.

Second Embodiment

The second embodiment is directed to another example of a semiconductor device having a similar metal sintered material to the first embodiment. In connection with the second embodiment, a description of the same or similar constituent elements as those of the previously provided descriptions may be omitted as appropriate.

Figure 5:
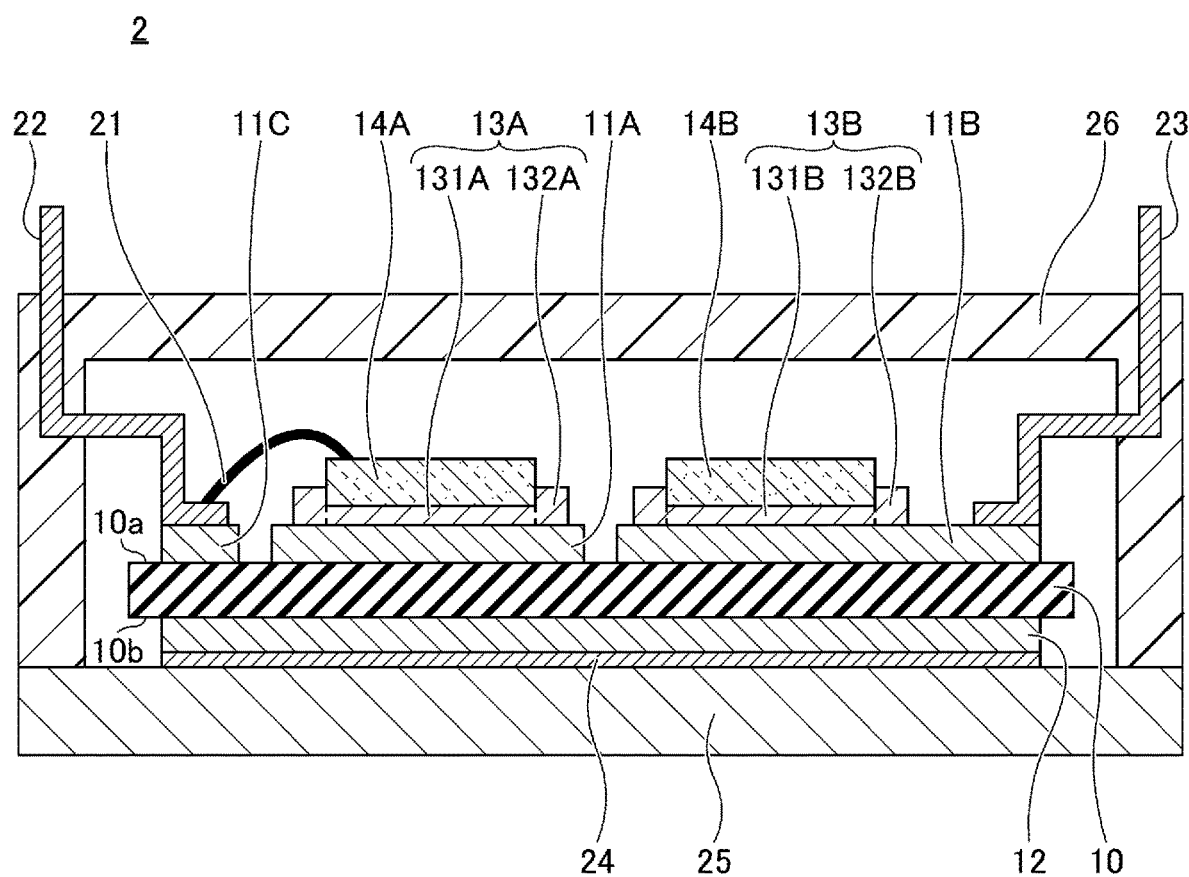
FIG. 5 is a cross-sectional view illustrating an example of a semiconductor device according to the second embodiment.

FIG. 5 is a cross-sectional view illustrating an example of a semiconductor device according to the second embodiment. Referring to FIG. 5, a semiconductor device 2 includes an insulating substrate 10, interconnect layers 11A, 11B, and 11C, an interconnect layer 12, metal sintered materials 13A and 13B, semiconductor chips 14A and 14B, metal wires 21, external connection terminals 22 and 23, solder 24, a base plate 25, and a resin case 26.

The interconnect layers 11A, 11B, and 11C are formed on the first surface 10a of the insulating substrate 10. The interconnect layer 12 is formed on the second surface 10b of the insulating substrate 10. The interconnect layers 11A, 11B, and 11C may each have a square plan shape with a uniform interior, for example. The interconnect layer 11C may be formed in a desired pattern. Cupper (Cu) or the like may be used as the material of the interconnect layers 11A, 11B, 11C, and 12. The thicknesses of the interconnect layers 11A, 11B, 11C, and 12 may approximately be 0.05 millimeters to 1 millimeter, for example.

The semiconductor chip 14A is bonded via the metal sintered material 13A to the interconnect layer 11A which serves as a chip mounting member. First electrodes (not shown) formed on the lower face of the semiconductor chip 14A are electrically connected to the interconnect layer 11A via the metal sintered material 13A. Second electrodes (not shown) formed on the upper face of the semiconductor chip 14A are electrically connected to the external connection terminals 22 or to the interconnect layer 11C via the metal wires 21 (e.g., gold wires, copper wires, or aluminum wires).

The semiconductor chip 14B is bonded via the metal sintered material 13B to the interconnect layer 11B which serves as a chip mounting member. Electrodes (not shown) formed on the lower face of the semiconductor chip 14B are electrically connected to the interconnect layer 11B via the metal sintered material 13B.

The semiconductor chips 14A and 14B are MOSFETs, SBDs, IGBTs, or the like, for example. A mix of these different chips may be used. For example, the semiconductor chip 14A may be a MOSFET and the semiconductor chip 14B may be an SBD. The size of the semiconductor chips 14A and 14B may be approximately 1 millimeter square to 10 millimeters square, for example. The thickness of the semiconductor chips 14A and 14B may approximately be 100 to 400 micrometers, for example. Si, SiC, GaN, or the like may be used as the material of the semiconductor chips 14A and 14B, for example. The semiconductor chip 14A and the semiconductor chip 14B may differ in size, thickness, and material.

The lower surface of the interconnect layer 12 is bonded to the upper surface of the metal base plate 25 via the solder 24. The resin case 26 that is a rectangular parallelepiped with an opening at the bottom is secured to the edges of the upper face of the base plate 25 to accommodate the semiconductor chips 14A and 14B and the like mounted on the insulating substrate 10. The external connection terminals 22 connected to the interconnect layer 11C and the external connection terminals 23 connected to the interconnect layer 11B protrude to the outside from the resin case 26, thereby allowing the semiconductor chips 14A and 14B to be connected to external circuitry.

The metal sintered material 13A is a bonding material having the same material and structure as the metal sintered material 13. The porosity ratio of the portion 131A is lower than the porosity ratio of the portion 132A. Similarly, the metal sintered material 13B is a bonding material having the same material and structure as the metal sintered material 13. The porosity ratio of the portion 131B is lower than the porosity ratio of the portion 132B.

In the process steps for manufacturing the semiconductor device 2, the portion 132A of the metal sintered material 13A surrounding the semiconductor chip 14A in the plan view is pressed prior to sintering, thereby having a lower porosity ratio than prior to the application of pressure. In the process steps for manufacturing the semiconductor device 2, the portion 132B of the metal sintered material 13B surrounding the semiconductor chip 14B in the plan view is pressed prior to sintering, thereby having a lower porosity ratio than prior to the application of pressure.

Namely, similarly to the semiconductor device 1, the portion 132A of the metal sintered material 13A and the portion 132B of the metal sintered material 13B are in an improved bonding condition, compared to an unpressed paste. As a result, the risk of disengagement of the portion 132A of the metal sintered material 13A and the portion 132B of the metal sintered material 13B is reduced, which improves the reliability of the semiconductor device 2.

Third Embodiment

The third embodiment is directed to another example of a semiconductor device having a similar metal sintered material to the first embodiment. In connection with the third embodiment, a description of the same or similar constituent elements as those of the previously provided descriptions may be omitted as appropriate.

Figure 6:
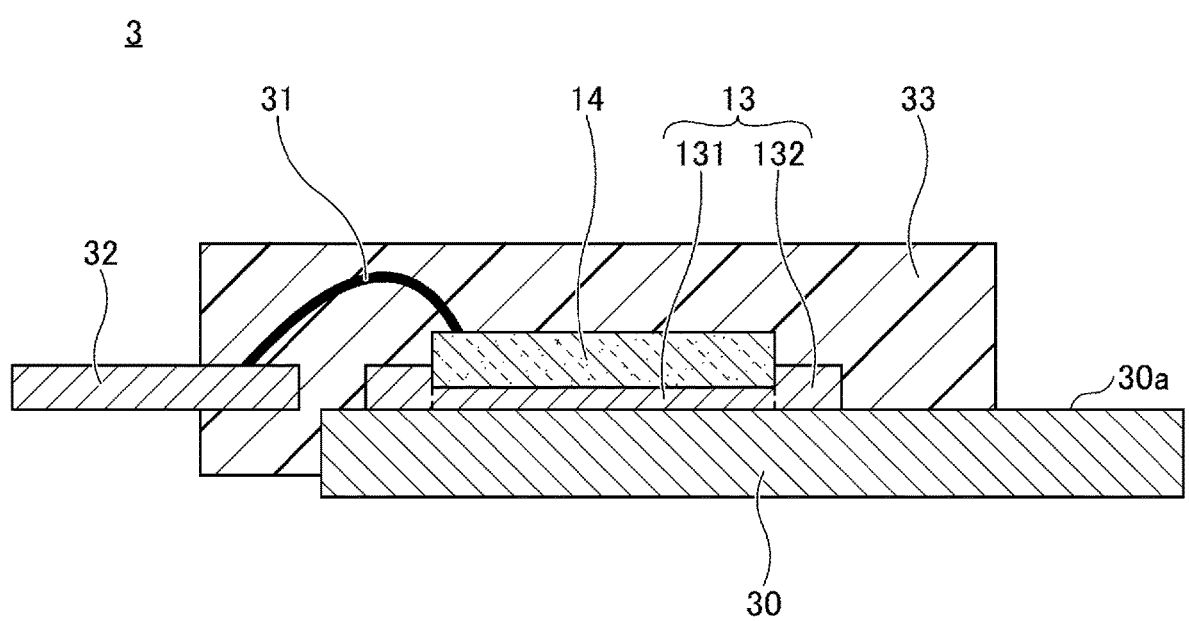
FIG. 6 is a cross-sectional view illustrating an example of a semiconductor device according to the third embodiment.

FIG. 6 is a cross-sectional view illustrating an example of a semiconductor device according to the third embodiment. Referring to FIG. 6, a semiconductor device 3 includes a die pad 30, a metal sintered material 13, a semiconductor chip 14, metal wires 31, external connection terminals 32, and a mold resin 33. The die pad 30 and the external connection terminals 32 constitute a lead frame formed by etching or pressing a metal plate.

The semiconductor chip 14 is bonded through the metal sintered material 13 to a first surface 30a of the die pad 30 (made of a metal such as copper) serving as a chip mounting member. First electrodes (not shown) formed on the lower face of the semiconductor chip 14 are electrically connected to the die pad 30 via the metal sintered material 13A. Second electrodes (not shown) formed on the upper face of the semiconductor chip 14 are electrically connected to the external connection terminals 32 via the metal wires 31 (e.g., gold wires, copper wires, or aluminum wires).

The mold resin 33 is disposed on part of the first surface 30a of the die pad 30 to encapsulate the semiconductor chip 14 and the like mounted on the die pad 30. The external connection terminals 32 and die pad 30 protrude externally from the mold resin 33 to allow the semiconductor chip 14 to be connected to external circuitry.

In the process steps for manufacturing the semiconductor device 3, the portion 132 of the metal sintered material 13 surrounding the semiconductor chip 14 in the plan view is pressed prior to sintering, thereby having a lower porosity ratio than prior to the application of pressure. Namely, similarly to the semiconductor device 1, the portion 132 of the metal sintered material 13 is in an improved bonding condition, compared to the unpressed paste. Accordingly, the risk of disengagement of the portion 132 of the metal sintered material 13 is reduced, which improves the reliability of the semiconductor device 3.

According to at least one embodiment, the reliability of a semiconductor device having a metal sintered material is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

In addition to the subject matter recited in the claims, the present disclosures include aspects of the subject matter as set out non-exhaustively in the following numbered clauses.

[Clause 1] A method of making a semiconductor device, comprising:
 printing and drying a paste of a metal sintered material at and around a chip mounting area of the chip mounting member;
 applying pressure to a periphery of the paste; and
 bonding a semiconductor chip to the chip mounting member through the metal sintered material by applying pressure to the paste situated within the chip mounting area through the semiconductor chip in a heated atmosphere to sinter the paste situated at and around the chip mounting area to form the metal sintered material,
 wherein the metal sintered material includes a first portion overlapping the semiconductor chip in a plan view, and includes a second portion surrounding the semiconductor chip in the plan view, and
 wherein a porosity ratio of the first portion is lower than a porosity ratio of the second portion.

[Clause 2] The method as recited in clause 1, wherein the porosity ratio of the second portion is lower than a porosity ratio of the printed paste observed immediately after printing the paste.

[Clause 3] The method as recited in clause 1 or 2, wherein a porosity ratio of the first portion is greater than or equal to 1% and less than 15%, and a porosity ratio of the second portion is greater than or equal to 15% and less than or equal to 50%.

[Clause 4] The method as recited in any one of clauses 1 to 3, wherein the second portion is thinner than a maximum thickness of the printed paste observed immediately after printing the paste, and the first portion is thinner than the second portion.

[Clause 5] The method as recited in any one of clauses 1 to 4, wherein one surface of the second portion in contact with the chip mounting member is parallel to another surface of the second portion opposite the one surface.

[Clause 6] The method as recited in any one of clauses 1 to 5, wherein an area pressed by the step of applying pressure to the periphery of the paste is a frame-shaped area of the past extending from inside an outer boundary of the chip mounting area to an outermost periphery of the paste.

[Clause 7] The method as recited in any one of clauses 1 to 6, wherein the step of applying pressure to the periphery of the paste applies pressure while heating the periphery of the paste, and wherein a heating temperature during the step of applying pressure to the periphery of the paste is lower than a heating temperature during the step of bonding the semiconductor chip.

What is claimed is:

1. A semiconductor device, comprising:
 a chip mounting member; and
 a semiconductor chip bonded to the chip mounting member through a metal sintered material,
 wherein the metal sintered material includes a first portion exactly overlapping the semiconductor chip in a plan view, and includes a second portion surrounding the first portion in the plan view, the first portion and the second portion being arranged next to each other without a gap therebetween,
 wherein a porosity ratio of the first portion is lower than a porosity ratio of the second portion, and
 wherein a thickness of the first portion is less than a thickness of any part of the second portion.

2. The semiconductor device as claimed in claim 1, wherein one surface of the second portion in contact with the chip mounting member is parallel to another surface of the second portion opposite the one surface.

3. The semiconductor device as claimed in claim 1, further comprising an insulating substrate having an interconnect layer disposed thereon, the interconnect layer being the chip mounting member.

4. The semiconductor device as claimed in claim 1, further comprising a lead frame having a die pad, the die pad being the chip mounting member.

5. The semiconductor device as claimed in claim 1, wherein an entirety of the first portion has a lower porosity ratio than an entirety of the second portion, a boundary between the first portion and the second portion extending along an entire outer perimeter of the semiconductor chip.

6. The semiconductor device as claimed in claim 1, wherein the metal sintered material is a compressed metal sintered material, and the first portion and the second portion are each a compressed metal sintered portion.

7. The semiconductor device as claimed in claim 1, wherein the metal sintered material contains silver or copper.

8. A method of making a semiconductor device, comprising:
 printing a paste of a metal sintered material at and around a chip mounting area of a chip mounting member;
 applying pressure to a periphery of the paste; and
 bonding a semiconductor chip to the chip mounting member through the metal sintered material by applying pressure to the paste situated within the chip mounting area through the semiconductor chip in a heated atmosphere to sinter the paste situated at and around the chip mounting area to form the metal sintered material,
 wherein the metal sintered material includes a first portion overlapping the semiconductor chip in a plan view, and includes a second portion surrounding the semiconductor chip in the plan view,
 wherein a porosity ratio of the first portion is lower than a porosity ratio of the second portion, and
 wherein a thickness of the first portion is less than a thickness of the second portion.

9. The method as claimed in claim 8, wherein the porosity ratio of the second portion is lower than a porosity ratio of the printed paste observed immediately after printing the paste.

10. The method as claimed in claim 8, wherein the porosity ratio of the first portion is greater than or equal to 1% and less than 15%, and the porosity ratio of the second portion is greater than or equal to 15% and less than or equal to 50%.

11. The method as claimed in claim 8, wherein the second portion is thinner than a maximum thickness of the printed paste observed immediately after printing the paste, and the first portion is thinner than the second portion.

12. The method as claimed in claim 8, wherein one surface of the second portion in contact with the chip mounting member is parallel to another surface of the second portion opposite the one surface.

13. The method as claimed in claim 8, wherein an area pressed by the step of applying pressure to the periphery of the paste is a frame-shaped area of the past extending from inside an outer boundary of the chip mounting area to an outermost periphery of the paste.

14. The method as claimed in claim 8, wherein the step of applying pressure to the periphery of the paste applies pressure while heating the periphery of the paste, and wherein a heating temperature during the step of applying pressure to the periphery of the paste is lower than a heating temperature during the step of bonding the semiconductor chip.

15. The method as claimed in claim 8, wherein the second portion is in direct contact with a side surface of the semiconductor chip.

16. The method as claimed in claim 8, wherein the metal sintered material contains silver or copper.

17. The method as claimed in claim 8, wherein the semiconductor device further includes an insulating substrate having an interconnect layer disposed thereon, the interconnect layer being the chip mounting member.

18. The method as claimed in claim 8, wherein the semiconductor device further includes a lead frame having a die pad, the die pad being the chip mounting member.

* * * * *